(12) United States Patent
Bedell et al.

(10) Patent No.: US 8,053,759 B2
(45) Date of Patent: Nov. 8, 2011

(54) ION IMPLANTATION FOR SUPPRESSION OF DEFECTS IN ANNEALED SIGE LAYERS

(75) Inventors: Stephen W. Bedell, Wappingers Falls, NY (US); Huajie Chen, Danbury, CT (US); Keith E. Fogel, Mohegan Lake, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 12/539,248

(22) Filed: Aug. 11, 2009

(65) Prior Publication Data

US 2010/0032684 A1 Feb. 11, 2010

Related U.S. Application Data

(62) Division of application No. 10/890,765, filed on Jul. 14, 2004, now abandoned.

(51) Int. Cl.
*H01L 29/30* (2006.01)
(52) U.S. Cl. .......... 257/19; 257/190; 257/616; 257/617; 257/E29.104; 257/E29.085
(58) Field of Classification Search .......... 257/19, 257/190, 616, 617, E29.104, E29.085
See application file for complete search history.

(56) References Cited

U.S. PATENT DOCUMENTS

| 7,164,187 B2 * | 1/2007 | Nagasawa ............ 257/617 |
| 2002/0185686 A1 | 12/2002 | Christiansen et al. |
| 2005/0054175 A1 | 3/2005 | Bauer |
| 2005/0151134 A1 | 7/2005 | Hsu et al. |

OTHER PUBLICATIONS

J. Cai, et al., "Strain relaxation and threading dislocation density in helium-implanted and annealed $Si_{1-x}/Si(100)$ heterostructures" Journal of Applied Physics, vol. 95, No. 10, May 15, 2004, pp. 5347-5351.

J. Cai et al., "Influence of He implantation conditions on strain relaxation and threading dislocation density in $Si_{0.2}$ virtual substrates", Mat. Res. Soc. Symp. Proc. vol. 809 (2004).

* cited by examiner

*Primary Examiner* — Minh-Loan T Tran
(74) *Attorney, Agent, or Firm* — Scully Scott Murphy & Presser, PC; Louis J. Percello, Esq.

(57) ABSTRACT

A substrate material including a Si-containing substrate and an insulating region that is resistant to Ge diffusion present atop the Si-containing substrate. The substrate material further includes a substantially relaxed SiGe alloy layer present atop the insulating region, wherein the substantially relaxed SiGe alloy layer has a planar defect density from about 5000 defects/$cm^{-2}$ or less. The substrate material may be employed in a heterostructure, in which a strained Si layer is present atop the substantially relaxed SiGe alloy layer of the substrate material.

6 Claims, 4 Drawing Sheets

ION IMPLANTATION FOR SUPPRESSION OF DEFECTS IN ANNEALED SIGE LAYERS

CROSS REFERENCE TO RELATED APPLICATIONS

This application is a divisional application of U.S. Ser. No. 10/890,765, filed on Jul. 14, 2004 which is related to co-pending and co-assigned U.S. patent application Ser. No. 10/654,231, filed Sep. 3, 2003, entitled "Method of Measuring Crystal Defects in Thin Si/SiGe Bilayers" now U.S. Pat. No. 6,803,240, as well as co-pending and co-assigned U.S. patent application Ser. No. 10/055,138, filed Jan. 23, 2003, entitled "Method of Creating High-Quality Relaxed SiGe-On-Insulator for Strained Si CMOS Applications" now U.S. Pat. No. 6,805,962. The entire contents of each of the aforementioned U.S. Applications are incorporated herein by reference.

FIELD OF THE INVENTION

The present invention relates to a semiconductor substrate material, and more particularly to a semiconductor substrate material that includes a substantially relaxed, high-quality SiGe alloy layer. The SiGe alloy layer of the inventive semiconductor substrate material, which is located on an upper surface thereof, has a reduced planar defect density as compared to prior art SiGe-containing substrate materials. The present invention also provides a method of fabricating the inventive substrate material in which the upper SiGe alloy layer of the substrate material has a reduced planar defect density.

BACKGROUND

In the semiconductor industry, the use of relaxed SiGe layers as a template for strained Si layer growth has been the primary approach employed to create tensile-strained Si for possible use in high-performance complementary metal oxide semiconductor (CMOS) circuits. The strained Si layers provide improved charge carrier transportation compared to unstrained materials.

The viability of using such materials in mainstream CMOS applications will ultimately depend on manufacturing issues such as cost and circuit yield. Because most techniques for creating a relaxed SiGe layer involve plastically deforming an initially pseudomorphic strained Si film, residual dislocation defects tend to be present in all relaxed SiGe and strained Si materials. Thus, in addition to yield challenges inherent to any material change in CMOS processing, the additional challenge of defect-related yield issues will exist as well.

To minimize this challenge, many approaches have been created in an attempt to reduce the dislocation defect density in relaxed SiGe and strained Si layers. Dislocation defects are generally reported in the prior art as threading defects, which are single defect lines that pass through, i.e., thread, a material layer. The density of the threading defects is generally reported in the range from $10^5$ to $10^8$ threads/cm$^2$. Due to their lower density and lack of any reliable defect etching techniques, there has essentially been no discussions or reports of planar defects (stacking faults or microtwins) in the literature.

Because typical densities of planar defects are below $10^6$ defects/cm$^2$, it becomes unlikely that even low magnification plan-view transmission electron microscopy (TEM) can detect these defects. Even if a very large prepared area was made and one planar defect was detected after 20 or so frames, it would tend to be discounted as anomalous.

A recent defect etch that was developed (see, U.S. application Ser. No. 10/654,231, filed Sep. 3, 2003, which has been incorporated herein by reference) to study strained Si and SiGe layers has shown that planar defects are far more ubiquitous than previously thought. Planar defects most likely represent a far more serious threat to device operation than an isolated threading dislocation because in contrast to a threading dislocation, a planar defect represents an entire plane of broken or distorted atomic bonds and therefore defects of this type affect a larger cross-sectional area of the crystal.

In view of the serious threat of planar defects, there is a need for developing a method to reduce stacking faults and other planar defects in strained Si/relaxed SiGe technologies.

SUMMARY

The present invention provides a method for suppressing the formation of planar defects, such as stacking faults and microtwins, in a relaxed SiGe alloy layer. Specifically, the method of the present invention uses ion implantation into a structure that includes a strained Ge-containing layer and a Si-containing substrate in order to suppress the formation of planar defects formed within the Ge-containing layer during a subsequent relaxation anneal. The ion implant creates a damaged region at or below an interface formed between the Ge-containing layer and Si-containing substrate that has a sufficient threshold energy that is capable of suppressing planar defects.

The Ge-containing layer includes a pure Ge layer as well as a SiGe alloy layer,
while the Si-containing substrate includes bulk Si-containing substrates as well as silicon-on-insulator (SOI) substrates. The method of the present invention provides a significant reduction (on the order of several orders of magnitude) in the planar defect density compared to controlled (non-implanted) SiGe layers.

In broad terms, the method of the present invention comprises the steps of:

forming a Ge-containing layer having strain on a surface of a Si-containing substrate;

implanting ions to create a damaged region at or below an interface between said Ge-containing layer and said Si-containing substrate; and heating said Ge-containing layer and said Si-containing substrate containing said damaged region at a temperature which forms at least a substantially relaxed SiGe alloy layer, wherein said damaged region suppresses planar defects from forming during said heating step.

As indicated above, the ions employed in the present invention create a damaged region within the structure that has sufficient threshold energy to suppress planar defect formation during the heating step. Illustrative examples of such ions that can be used in the present invention include, but are not limited to: H, He, Ne, C, O, F, B, P, Si or mixtures and isotopes thereof. In one embodiment, O ions and their isotopes are preferred. In an alternate embodiment, H-containing ions (H, $H_2$, $CH_2$, etc.) and their isotopes are preferred. In still another embodiment, F ions and their isotopes are preferred.

The present invention also provides a semiconductor substrate material that includes a high-quality, substantially relaxed SiGe alloy layer that has a planar defect density that is less than 5000 planar defects/cm$^2$.

DETAILED DESCRIPTION

Figure 1A:
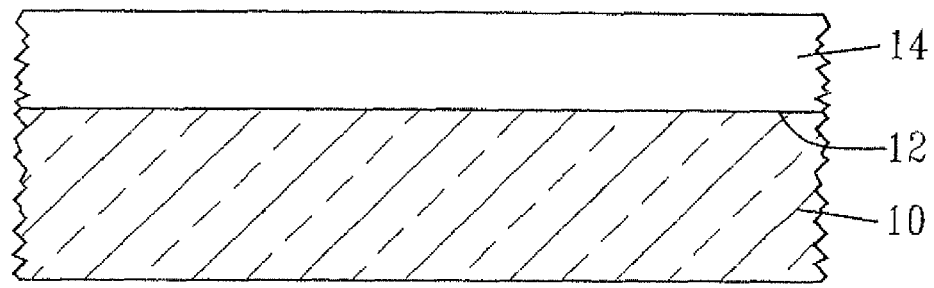
FIGS. 1A-1E are pictorial representations (through cross sectional views) illustrating the basic processing steps of the present invention.

The present invention, which provides a method of fabricating a substantially relaxed SiGe alloys layer on a Si-containing substrate as well as the resultant substrate material and heterostructure containing the same, will now be described in greater detail by referring to the drawings that accompany the present application. In the drawings, like and/or corresponding elements are referred to by like reference numerals.

Reference is first made to FIGS. 1A-1E which illustrate the basic processing steps that are employed in forming a substantially relaxed SiGe alloy layer having a suppressed planar defect density. Specifically, FIG. 1A shows the initial structure that is formed after forming a strained Ge-containing layer 14 on a surface of a Si-containing substrate 10. The interface that exists between the Ge-containing layer 14 and the Si-containing substrate 10 is labeled as reference numeral 12 in FIG. 1A. The term "Si-containing substrate" as used herein denotes any semiconductor material that includes silicon. Illustrative examples of suitable Si-containing substrates that can be employed in the present invention include, but are not limited to: Si, SiGe, SiC, SiGeC, Si/Si, Si/SiC, Si/SiGeC and preformed silicon-on-insulators (SOIs) which may include any number of buried insulating (continuous, non-continuous or mixtures of continuous and non-continuous) regions present therein.

The strained Ge-containing layer 14 formed at this point of the present invention may be a SiGe alloy layer or a pure Ge layer. The term "SiGe alloy layer" includes SiGe alloys that comprise up to 99.99 atomic percent Ge, whereas pure Ge includes layers that comprise 100 atomic percent Ge. When SiGe alloy layers are employed, it is preferred that the Ge content in the SiGe alloy layer be from about 0.1 to about 99.9 atomic percent, with a Ge atomic percent of from about 10 to about 35 being even more highly preferred.

In accordance with the present invention, a strained Ge-containing layer 14 is formed atop an upper surface of the Si-containing substrate 10 forming interface 12 using any conventional epitaxial growth method that is well known to those skilled in the art which is capable of (i) growing a thermodynamically stable (below a critical thickness) SiGe alloy or pure Ge layer, (ii) growing a SiGe alloy or pure Ge layer that is metastable and free from defects, i.e., misfit and TD dislocations, or (iii) growing a partially relaxed SiGe layer, yet strained; the extent of relaxation being controlled by growth temperature, Ge concentration, thickness, or the presence of a Si-containing capping layer.

Illustrative examples of such epitaxial growing processes that are capable of satisfying conditions (i), (ii) or (iii) include, but are not limited to: low-pressure chemical vapor deposition (LPCVD), ultra-high vacuum chemical vapor deposition (UHVCVD), atmospheric pressure chemical vapor deposition (APCVD), molecular beam (MBE) epitaxy and plasma-enhanced chemical vapor deposition (PECVD).

The thickness of the strained Ge-containing layer 14 formed at this point of the present invention may vary, but typically the Ge-containing layer 14 has a thickness from about 10 to about 500 nm, with a thickness from about 20 to about 200 nm being more highly preferred.

In an optional embodiment of the present invention (not shown), an optional cap layer is formed atop Ge-containing layer 14 at this point of the present invention, i.e., prior to ion implantation and performing the heating step of the present invention. The optional cap layer employed in the present invention comprises any Si-containing material including, but not limited to: epitaxial silicon (epi-Si), epitaxial silicon-germanium (epi-SiGe), amorphous silicon (a:Si), amorphous silicon-germanium (a:SiGe), single or polycrystalline Si or any combination thereof including multilayers. In a preferred embodiment, the optional cap layer is comprised of epi Si. It is noted that layer 14 and the optional cap layer may, or may not, be formed in the same reaction chamber.

When present, the optional cap layer has a thickness from about 1 to about 100 nm, with a thickness from about 1 to about 30 nm being more highly preferred. The optional cap layer is formed utilizing any well-known deposition process including the epitaxial growth processes mentioned above.

In one embodiment of the present invention, it is preferred to form a pure Ge or SiGe alloy (15 to 20 atomic percent Ge) layer 14 having a thickness from about 1 to about 2000 nm on the surface of the Si-containing substrate 10, and thereafter form a Si-containing cap layer having a thickness from about 1 to about 100 nm atop the Ge-containing layer 14.

Figure 1B:
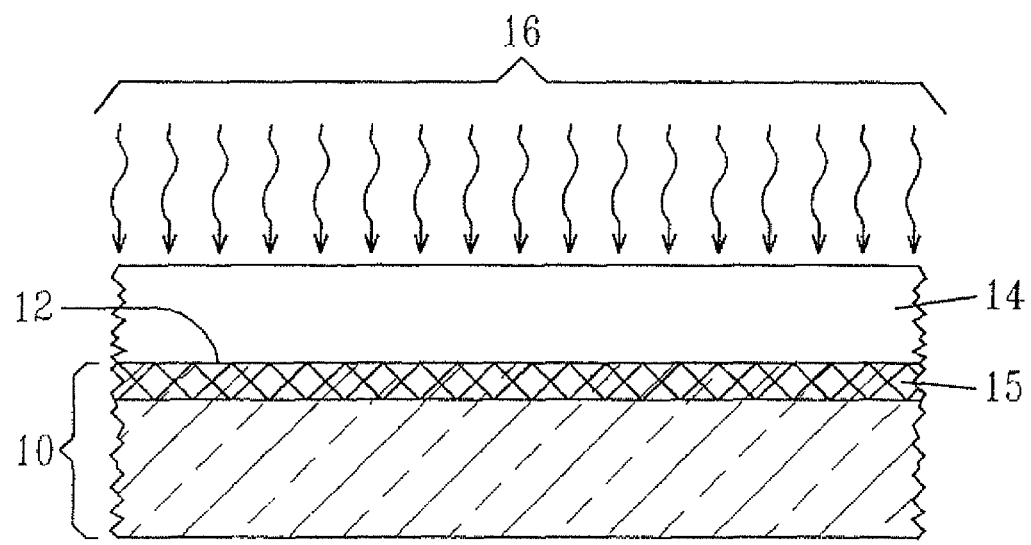
Figure 1C:
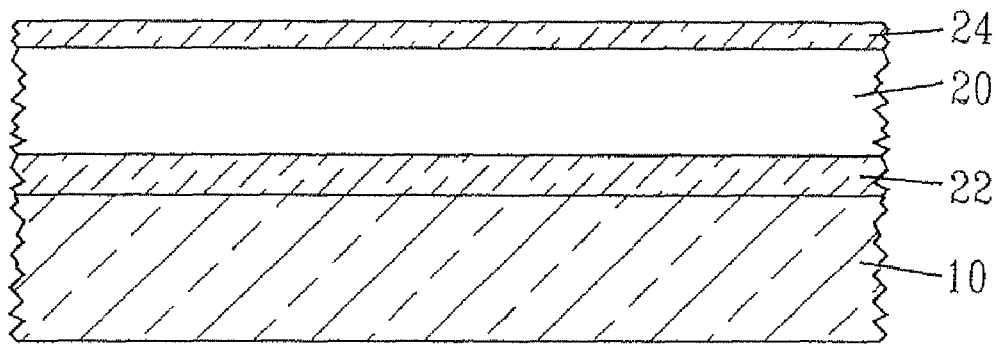

Next, and as shown in FIG. 1B, ions 16 are implanted into the structure shown in FIG. 1A (or a structure including an optional cap layer atop layer 14) such that a damaged region is located at or below interface 12. Reference numeral 15 denotes the damaged region that is formed during this ion implantation step. The ion implantation can be a blanket ion implantation process as shown, or alternatively, a masked ion implantation process (not shown) can be utilized. Masked ion implantation provides a means for fabricating discrete regions in which a substantially relaxed SiGe alloy layer having reduced planar defects could be formed adjacent to a relaxed SiGe alloy layer that does not contain the suppressed planar defect density.

Specifically, ion implantation is performed using a conventional ion implantation apparatus wherein at least one ion of H, He, Ne, C, O, F, B, P or Si, including isotopes thereof, is used. Preferred ions employed in the present invention for suppressing planar defect formation are O, F or H ions, or any isotope thereof, implanted using any molecular or charge state.

The damaged region 15 formed at this point of the present invention has a threshold energy value that is sufficient to suppress planar defects from forming during the subsequent heating step and depends on the mass of the implanted ion. The damaged region 15 is typically formed about 0 to about 500 Å below the interface 12. An important role of the implantation step is to deposit energy from the incoming ions to the lattice atoms at or near the interface 12. The transferral of kinetic energy from the ions to the target atoms near interface 12 results in the formation of vacancies, phonons, recoiled atoms and other lattice defects. It is believed that the lattice defects near interface 12 caused by the energy deposition inhibits the formation of planar defects, such as stacking faults, during the subsequent SiGe alloy layer relaxation step.

The implant conditions used in forming the damaged region 15 vary depending upon the type of ions 16 being implanted. The supression of stacking faults during relaxation of the SiGe alloy layer appears to be related to damage produced near the interface 12. The amount of damage created by the implant step is related to the amount of energy transferred from the incoming ions to the lattice atoms. The energy deposited within a given region of the initial structure can be estimated using available software code such as SRIM, see, J. F. Ziegler, et al., "The Stopping and Range of Ions Solids", Version 2003.20. The relevant energy terms from a typical SRIM calculation are the energy converted into phonons and the energy transferred to recoils. The energy converted to phonons near the interface 12 must be greater than $2.5 \times 10^{15}$ in units of (electron-volts per Ångstrom) per $cm^2$. These units are the output of the SRIM calculation for the energy loss to phonons (eV/Å) at the interface 12 multiplied by the required dose. In a similar manner, the energy transferred to recoils calculated using SRIM near the interface 12 must be greater than $2.5 \times 10^{15}$ in units of (electron-volts per Ångstrom) per $cm^2$. It is possible to specify the energy transferred from the ions to the lattice atoms in the region at or near interface 12 as the sum of the energy loss to phonons and the energy transferred to recoils using the above-mentioned procedures. Therefore, the relationship between ion species, energy and dose necessary to suppress stacking fault formation is determined by the condition that the sum of the energy loss to phonons and the energy transferred to recoils calculated using SRIM near interface 12 be greater than $5 \times 10^{15}$ (eV/Å)(cm$^{-2}$). To estimate the dose required to suppress stacking faults for a given ion species and energy, the structure to be implanted is inputted into SRIM as well as the selected ion species and energy. The values of the energy loss to phonons and the energy transferred to recoils at the position of interface 12 are added together and the threshold value between $5 \times 10^{15}$ to $15 \times 10^{15}$ is divided by this number to give the ion dose range (in atoms/cm$^2$). The lower limit of the threshold energy value ($5 \times 10^{15}$ (eV/Å)(cm$^{-2}$)) is determined by the required energy density to create sufficient lattice damage near interface 12 to suppress planar defect formation during subsequent annealing. The upper limit of the threshold energy value ($15 \times 10^{15}$ (eV/Å)(cm$^{-2}$)) is determined by staying below the energy density that will amorphize all or part of the SiGe alloy layer. This range is sensitive to the temperature of the substrate during implantation as well as ion beam current densities. Chilled (lower than 20° C.) and heated (greater than 20° C.) implantation steps are both contemplated herein.

The prescription given above can be used to estimate the required dose for any ion/energy combination that will result in a lower planar defect density during relaxation of the SiGe alloy layer. Typically, the ions are implanted using an ion dosage from about $1 \times 10^{14}$ to about $3 \times 10^{16}$ atoms/cm$^2$, with an ion dosage from about $2 \times 10^{14}$ to about $2.8 \times 10^{16}$ atoms/cm$^2$ being more typical. The ion implantation is typically carried out in an ion implantation apparatus that operates at a beam current density from about 0.05 to about 50 milliamps cm$^{-2}$ and at an energy from about 4 to about 250 keV. More preferably, the implant is performed using an energy from about 5 to about 200 keV. The implant generally is performed at a substrate temperature from about −50° to about 550° C. A single implant step can be employed, or multiple implant steps can be used as well.

In a highly preferred embodiment of the present invention, O ions are implanted into the structure shown in FIG. 1A. In this embodiment of the present invention, the O implantation is performed using an O ion dose from about $1 \times 10^{14}$ to about $1 \times 10^{16}$ atoms/cm$^2$, with an O ion dose from about $5 \times 10^{14}$ to about $5 \times 10^{15}$ atoms/cm$^2$ being more typical. The O implantation is performed using an implant energy from about 50 to about 500 keV, with an oxygen implant energy from about 80 to about 250 keV being more typical.

In another preferred embodiment of the present invention, H ions are implanted into the structure shown in FIG. 1A. In this embodiment of the present invention, the H implantation is performed using an H ion dose from about $1 \times 10^{16}$ to about $3 \times 10^{16}$ atoms/cm$^2$, with an H ion dose from about $1.5 \times 10^{16}$ to about $2.8 \times 10^{16}$ atoms/cm$^2$ being more typical. The H implantation is performed using an implant energy from about 4 to about 50 keV, with an oxygen implant energy from about 5 to about 40 keV being more typical.

After ion implantation, the structure shown in FIG. 1B is then heated, i.e., annealed, at a temperature which can permits relaxation of the SiGe alloy layer 14. If the substrate 10 is part of a silicon-on-insulator (SOI) substrate, then the heating step can be used to form a SGOI layer in a manner described in U.S. patent application Ser. No. 10/055,138, filed Jan. 23, 2003, entitled "Method of Creating High-Quality Relaxed SiGe-On-Insulator for Strained Si CMOS Applications". The SGOI formed using the thermal mixing technique (FIG. 1C) in conjunction with the implantation step described here will have a lower stacking fault density than if no implantation was performed. Note that oxide layer 24 is formed atop layer 20 during the heating step. Oxide layer 24 is typically, but not always, removed from the structure after the heating step using a conventional wet etch process wherein a chemical etchant such as HF that has a high selectivity for removing oxide as compared to SiGe is employed. If substrate 10 is not part of a SOI substrate, the heating step relaxes the SiGe layer 14 while suppressing planar defect generation.

Note that when the oxide layer is removed, a single crystal Si-containing layer (not shown) can be formed atop layer 20 and the above processing steps of the present invention may be repeated any number of times to produce a multilayered relaxed SiGe substrate material.

The oxide layer 24 formed after the heating step of the present invention has a variable thickness which may range from about 10 to about 1000 nm, with a thickness from about 20 to about 500 nm being more typical.

Specifically, the heating step of the present invention is an annealing step that is performed at a high temperature from about 900° C. to about 1350° C., with a temperature from about 1200° C. to about 1335° C. being more highly preferred when the substrate 10 is part of a SOI substrate. Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne. A preferred temperature range from 800° C. to about 1050° C. is used in the present invention when the substrate 10 is a non-SOI substrate to prevent Ge loss into the substrate 10 during the anneal. An oxidizing or non-oxidizing ambient can be used during the annealing step when substrate 10 is a non-SOI substrate.

The heating step may be carried out for a variable period of time that typically ranges from about 10 to about 1800 minutes, with a time period from about 60 to about 600 minutes being more highly preferred. The heating step may be carried out at a single targeted temperature, or various ramp and soak cycles using various ramp rates and soak times can be employed.

When a SOI substrate is used, the heating step is performed under an oxidizing ambient to achieve the presence of a surface oxide layer, i.e., layer 24, which acts as a diffusion barrier to Ge atoms. Therefore, once the oxide layer 24 is formed on the surface of the structure, Ge becomes trapped between barrier layer 22 and oxide layer 24. As the surface oxide increases in thickness, the Ge becomes more uniformly distributed throughout layers 10, 14, and optionally the cap layer, but it is continually and efficiently rejected from the encroaching oxide layer. So as the (now homogenized) layers are thinned during this heating step, the relative Ge fraction increases. Efficient thermal mixing is achieved in this embodiment of the present invention when the heating step is carried out at a temperature of from about 1200° C. to about 1320° C. in a diluted oxygen-containing gas.

It is also contemplated herein to use a tailored heat cycle that is based upon the melting point of the SiGe layer. In such an instance, the temperature is adjusted to tract below the melting point of the SiGe layer.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

When a SOI substrate is used, the role of the high-temperature heating step of the present invention is (1) to form a barrier layer 22 that is resistant to Ge diffusion in the Si-containing substrate, (2) to allow Ge atoms to diffuse more quickly thereby maintaining a homogeneous distribution during annealing, and (3) to subject the initial layered structure to a thermal budget which will facilitate an equilibrium configuration. The heating step can also increase the degree of relaxation of the initial strained Ge-containing layer 14. After this heating step has been performed, the structure includes a uniform and substantially relaxed SiGe alloy layer, i.e., layer 20, sandwiched between the barrier layer 22 and surface oxide layer 24.

It is noted that the ions implanted previously into the structure facilitate the relaxation of the strained Ge-containing layer 14, while effectively suppressing planar defects such as stacking faults and microtwins from forming during the thermal mixing process. The mechanism for this phenomenon has not been extensively studied by the applicants.

In accordance with the present invention, the substantially relaxed SiGe alloy layer 20 has a thickness of about 2000 nm or less, with a thickness from about 10 to about 100 nm being more highly preferred. The barrier layer 22 formed during the annealing step of the present invention has a thickness of about 500 nm or less, with a thickness from about 50 to about 200 nm being more highly preferred. Note that the substantially relaxed SiGe alloy layer 20 formed in the present invention has a defect density including misfits and TDs, of less than about $5 \times 10^7$ defects/cm$^2$. This defect density value approaches those reported for contemporary SGOI materials.

More importantly, the SiGe alloy layer 20 of the present invention has a reduced planar defect density than that achieved using prior art methods. Specifically, the SiGe alloy layer 20 has a planar defect density that is less than 5000 planar defects/cm$^2$, with a planar defect density of less than 100 planar defects/cm$^2$ being more typical. The planar defects, particularly the stacking faults, can be measured using the etching technique described in U.S. patent application Ser. No. 10/654,231, which application was previously incorporated herein in its entirety. Note that when the defect etching technique described in the '231 Application is employed, a strained Si layer, to be subsequently described herein, is formed atop the relaxed SiGe alloy layer 20 prior to etching.

The substantially relaxed SiGe alloy layer 20 formed in the present invention has a final Ge content of from about 0.1 to about 99.9 atomic percent, with an atomic percent of Ge of from about 10 to about 35 being more highly preferred. Another characteristic feature of the substantially relaxed SiGe layer 20 is that it has a measured lattice relaxation of from about 1 to about 100%, with a measured lattice relaxation of from about 50 to about 80% being more highly preferred.

Figure 1D:
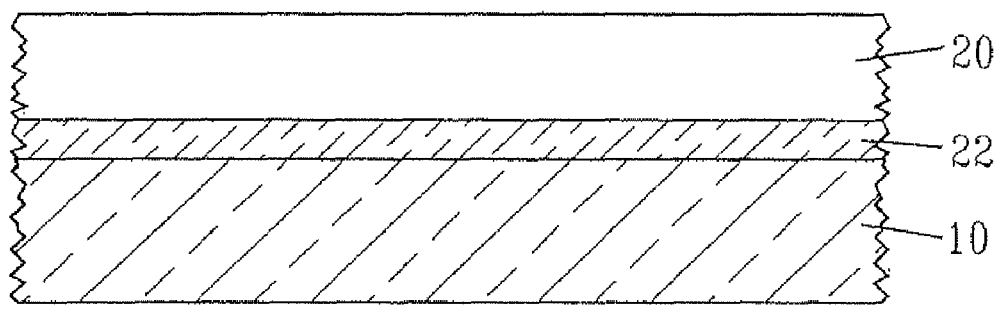

As stated above, the surface oxide layer 24 may be stripped at this point of the present invention so as to provide the SiGe-on-insulator substrate material shown, for example, in FIG. 1D (note that the substrate material does not include the cap layer since that layer has been used in forming the relaxed SiGe layer).

Figure 1E:
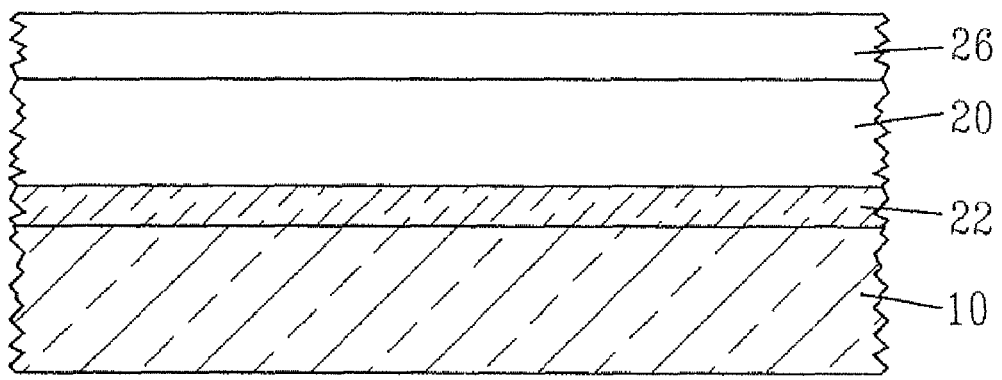

FIG. 1E show the structure that is obtained after forming a Si-containing layer 26 atop the SiGe layer 20. Si-containing layer 26 is formed using a conventional epitaxial deposition process well known in the art. The thickness of the Si-containing layer 26 may vary, but typically, the Si-containing layer 26 has a thickness from about 1 to about 100 nm, with a thickness from about 1 to about 30 nm being more highly preferred. The Si-containing layer 26 may include: epitaxial silicon (epi-Si), epitaxial silicon-germanium (epi-SiGe), amorphous silicon (a:Si), amorphous silicon-germanium (a:SiGe), single or polycrystalline Si or any combination thereof including multilayers.

In some instances, additional SiGe can be formed atop the substantially relaxed SiGe layer 20 utilizing the above mentioned processing steps, and thereafter the Si-containing layer 26 may be formed. Because layer 20 has a large in-plane lattice parameter as compared to layer 26, Si-containing layer 26 will be strained in a tensile manner.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers Si and SiGe formed atop the substantially relaxed SiGe layer of the substrate material.

In the case of lattice mismatched structures, GaAs, GaP or other like compound would be formed atop the substantially relaxed SiGe layer of the inventive SiGe-on-insulator substrate material.

Figure 2:
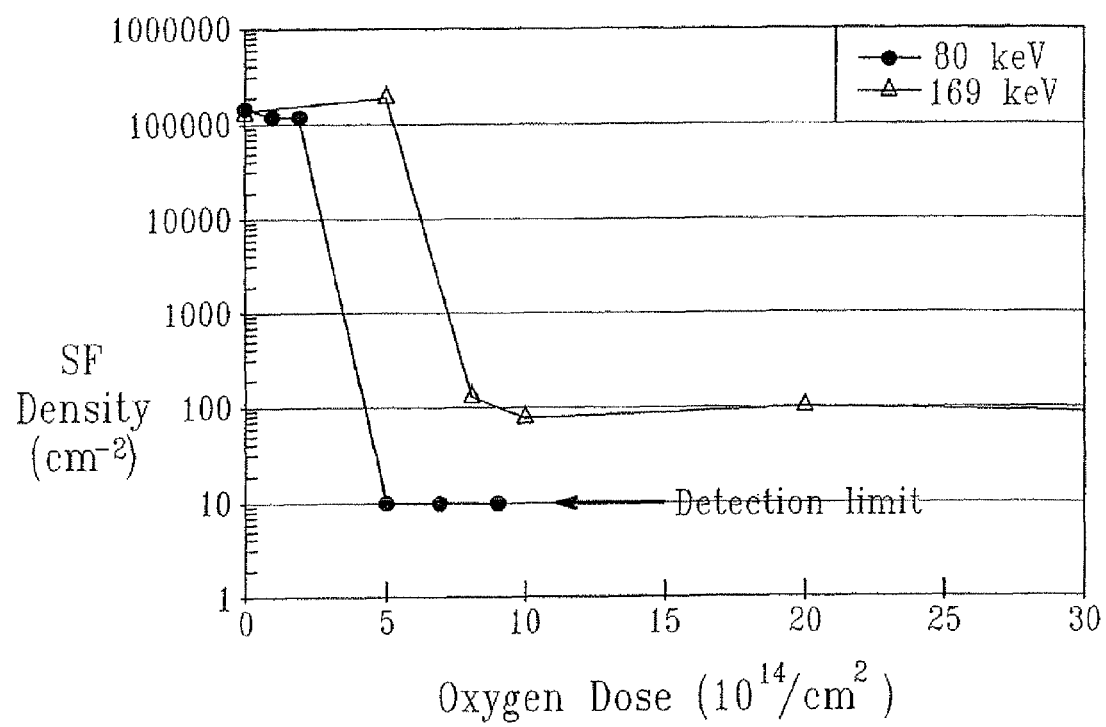
FIG. 2 is a plot showing the measured planar defect density (defect/cm$^2$) vs. oxygen (O) dose ($10^{14}$ atoms/cm$^2$) for an O energy of 169 and 80 keV.

Reference is made to FIG. 2, which is a plot of the measured planar defect density vs. O implantation dose for an O energy of 80 and 169 keV. In this example, the initially formed SiGe layer was a 1000 Å-17% pseudomorphic SiGe layer on an SOI substrate. The thermal processing step was a 1250° C. step to form a uniform 800 Å-21% (80 keV) and a 750 Å-23% (169 keV) relaxed SiGe-on-insulator substrate material which was then capped with a 180 Å strained Si layer. The defects were measured using the chemical defect etching described in the '231 Application mentioned supra. The data points in FIG. 2 represent the stacking fault densities measured using an optical microscope after etching the Si/SGOI layers in a dilute Secco solution according to the method described in the '231 Application. The critical dose for 80 keV oxygen is about 4E14 O/cm$^2$ whereas for 169 keV oxygen it is about 7E14 O/cm$^2$. This corresponds to a threshold energy value (described above) at interface 12 of 11.2E15 and 9.8E15 (eV/Å)(cm$^{-2}$) for the 80 and 169 keV data, respectively.

Figure 3A:
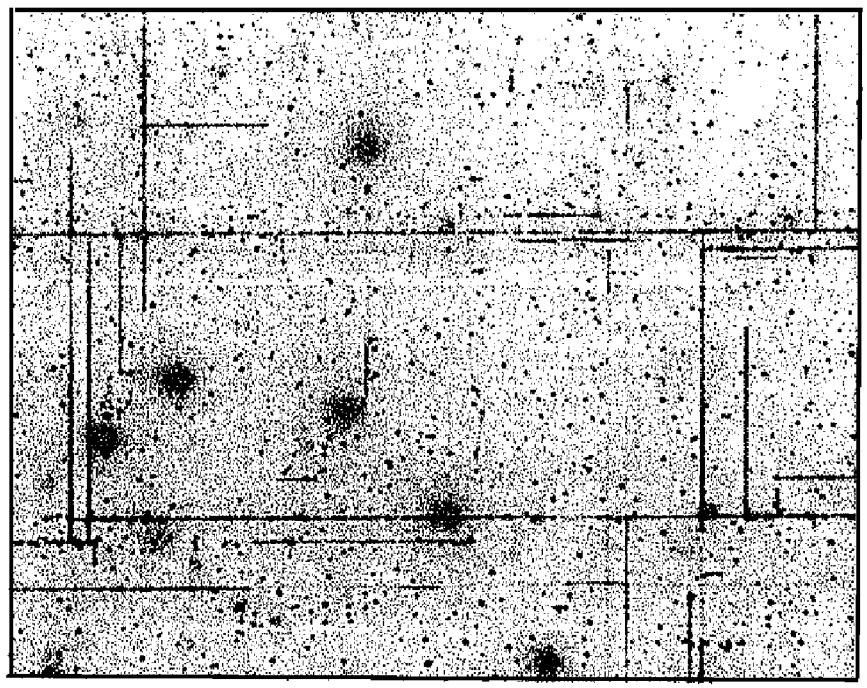
FIG. 3A shows an optical defect micrograph of a relaxed SiGe layer that received no H implant prior to the relaxation step.
Figure 3B:
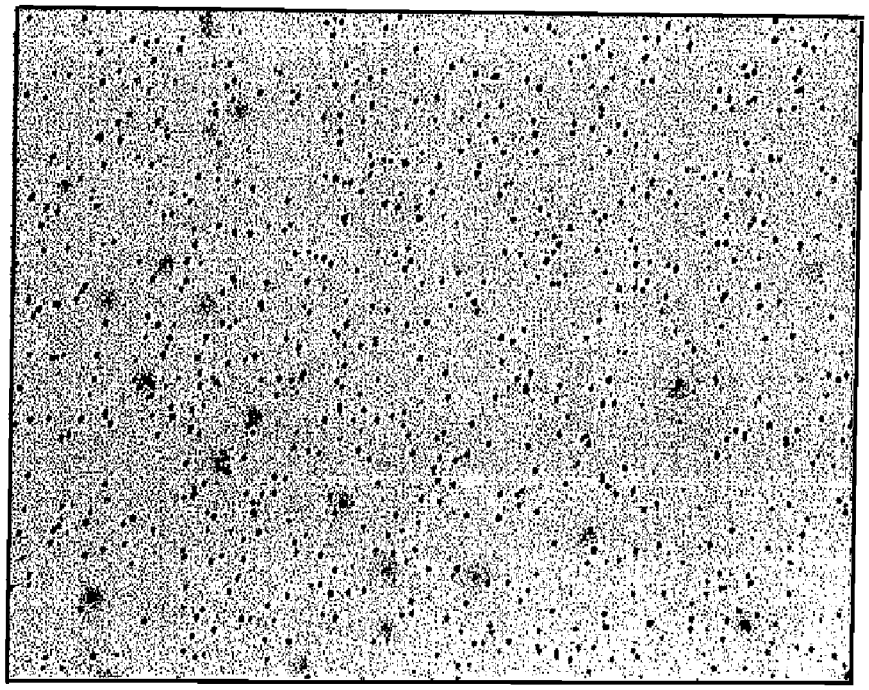
FIG. 3B shows an optical defect micrograph of a relaxed SiGe layer which received a H implantation step of 19 keV $H_2^+$ at a dose of $1.3\times10^{16}$ $H_2^+$/cm$^2$ prior to the relaxation step.

FIGS. 3A and 3B show an example of using $H_2^+$ ions to suppress SF defects. In this example, the initially formed SiGe layer was a 1000 Å-17% pseudomorphic SiGe layer on an SOI substrate. 19 keV $H_2^+$ ions were implanted into the structure at a dose of 1.3E16 $H_2$/cm$^2$. The thermal processing step was a 1250° C. step to form a uniform 800 Å-21%. The surface oxide was removed and a 180 Å Si layer was grown in order to defect etch the samples according to the '231 Application. FIG. 3A shows the optical micrograph of the etched control sample (no implant) and FIG. 3B shows the optical micrograph of the sample which received the H implant before annealing. The critical dose of about 2.5E16 H/cm$^2$ for 9.5 keV H was simulated to give a threshold energy value at the interface 12 of 10.7E15 (eV/Å)(cm$^{-2}$) using SRIM.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim as new is:

1. A substrate material comprising:
   a Si-containing substrate;
   an insulating region that is resistant to Ge diffusion present atop said Si-containing substrate; and
   a substantially relaxed SiGe alloy layer present atop said insulating region, wherein said substantially relaxed SiGe alloy layer has a planar defect density from about 5000 defects/cm$^{-2}$ or less.

2. The substrate material of claim 1 wherein said substantially relaxed SiGe alloy layer has a measured lattice relaxation of from about 1 to about 100%.

3. A hetero structure comprising:
   a Si-containing substrate;
   an insulating region that is resistant to Ge diffusion present atop the Si-containing substrate;
   a substantially relaxed SiGe alloy layer present atop the insulating region, wherein the substantially relaxed SiGe alloy layer has a planar defect density from about 5000 defects/cm$^{-2}$ or less; and
   a strained Si layer formed atop the substantially relaxed SiGe alloy layer.

4. The heterostructure of claim 3 wherein said substantially relaxed SiGe alloy layer has a measured lattice relaxation of from about 1 to about 100.

5. The heterostructure of claim 3 wherein said strained Si layer is replaced with a lattice mismatched compound selected from the group consisting of GaAs and GaP.

6. The heterostructure of claim 3 wherein alternating layers of relaxed SiGe and strainedSi are formed atop said strained Si layer.

* * * * *